(12) United States Patent
Pauliac

(10) Patent No.: US 9,305,783 B2
(45) Date of Patent: Apr. 5, 2016

(54) NANOMETRIC IMPRINT LITHOGRAPHY METHOD

(75) Inventor: Sebastien Pauliac, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 340 days.

(21) Appl. No.: 13/997,002

(22) PCT Filed: Dec. 21, 2011

(86) PCT No.: PCT/EP2011/073705
§ 371 (c)(1),
(2), (4) Date: Sep. 17, 2013

(87) PCT Pub. No.: WO2012/085164
PCT Pub. Date: Jun. 28, 2012

(65) Prior Publication Data
US 2014/0004313 A1    Jan. 2, 2014

(30) Foreign Application Priority Data

Dec. 22, 2010 (FR) .................................. 10 61018

(51) Int. Cl.
*G03F 7/00* (2006.01)
*H01L 21/033* (2006.01)
*B82Y 10/00* (2011.01)
*B82Y 40/00* (2011.01)

(52) U.S. Cl.
CPC ............. *H01L 21/0337* (2013.01); *B82Y 10/00* (2013.01); *B82Y 40/00* (2013.01); *G03F 7/0002* (2013.01); *Y10S 977/887* (2013.01); *Y10T 428/24612* (2015.01)

(58) Field of Classification Search
None
See application file for complete search history.

(56) References Cited

U.S. PATENT DOCUMENTS

| 4,738,910 A | 4/1988 | Ito et al. |
| 5,641,607 A * | 6/1997 | Ogawa ................... G03F 7/091 |
| | | 257/E21.028 |
| 7,374,864 B2 * | 5/2008 | Guo ....................... B82Y 10/00 |
| | | 264/494 |

(Continued)

FOREIGN PATENT DOCUMENTS

| EP | 0 205 148 | 12/1986 |
| JP | 2004 304097 | 10/2004 |
| WO | 2005 029179 | 3/2005 |

OTHER PUBLICATIONS

Cheng, X., et al., "A combined-nanoimprint-and-photolithography patterning technique," Microelectronic Engineering, vol. 71, pp. 277-282, (Jan. 1, 2004), XP002616560.

(Continued)

*Primary Examiner* — Anita Alanko
(74) *Attorney, Agent, or Firm* — Oblon, McClelland, Maier & Neustadt, L.L.P.

(57) ABSTRACT

A nanoimprint lithography method, including: pressing a mold in a photosensitive resin to form at least one imprint pattern defined by a stamped area and an adjacent area, the adjacent area being less stamped or not stamped at all, and being thicker than the stamped area; and exposure to a certain amount of sunlight. Respective thicknesses of the two areas are defined such that the two areas absorb a different amount of the sunlight and the amount of sunlight provided by the exposure is predetermined so as to be great enough to activate the resin in whichever of the two areas has the greater absorption, and so as not to be great enough to activate the other of the two areas.

20 Claims, 11 Drawing Sheets

(56) References Cited

U.S. PATENT DOCUMENTS

| | | | |
|---|---|---|---|
| 7,776,628 B2* | 8/2010 | Colburn | B82Y 10/00 438/22 |
| 2002/0117111 A1 | 8/2002 | Yoshihara | |
| 2009/0189317 A1 | 7/2009 | Sato et al. | |
| 2009/0224436 A1* | 9/2009 | Mikami | B82Y 10/00 264/447 |
| 2010/0078860 A1* | 4/2010 | Yoneda | B29C 37/0003 264/496 |
| 2011/0111593 A1* | 5/2011 | Kanno | B82Y 10/00 438/689 |

OTHER PUBLICATIONS

International Search Report Issued Feb. 23, 2012 in PCT/EP11/073705 Filed Dec. 21, 2011.

* cited by examiner

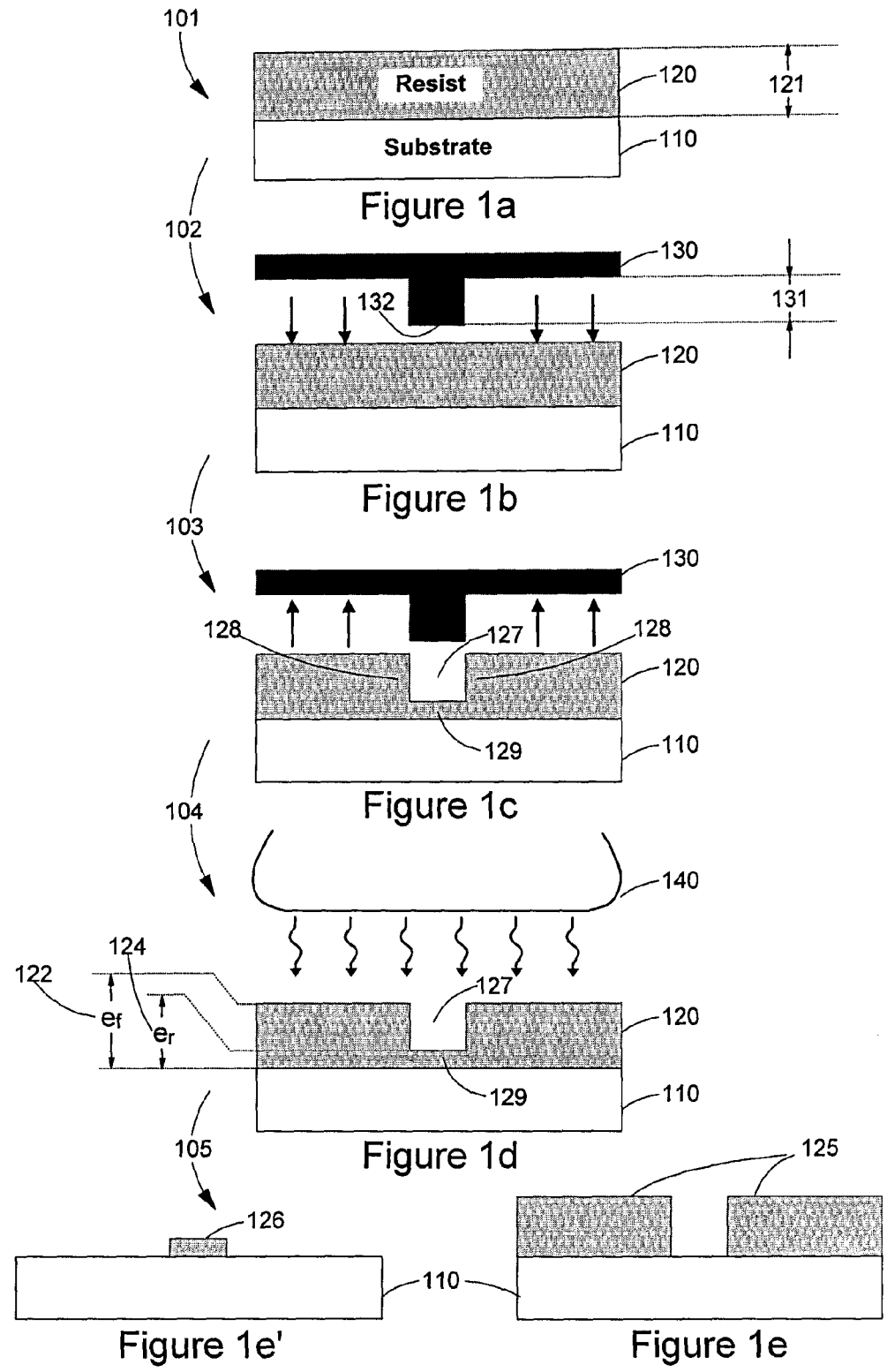

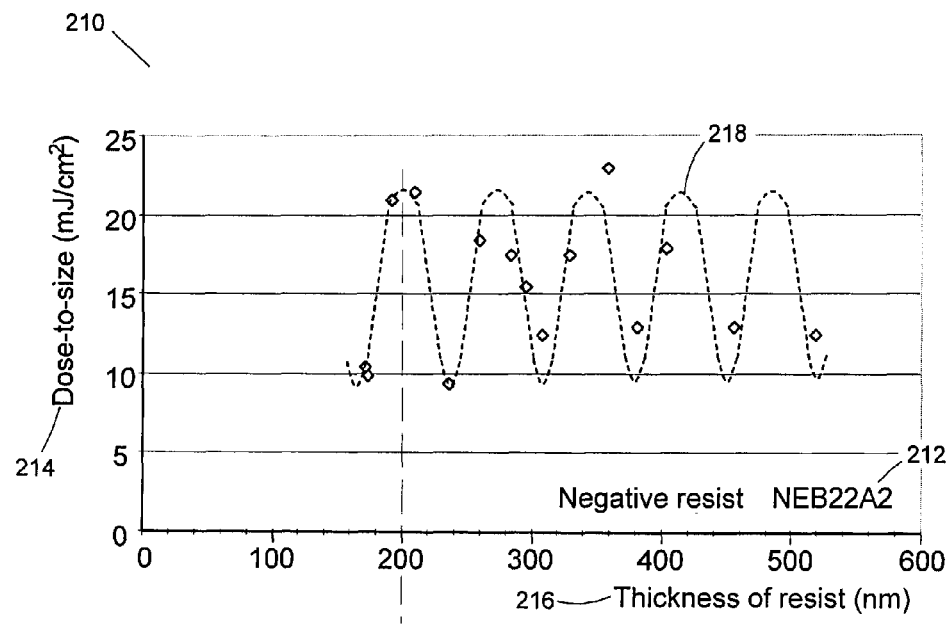
Figure 2a
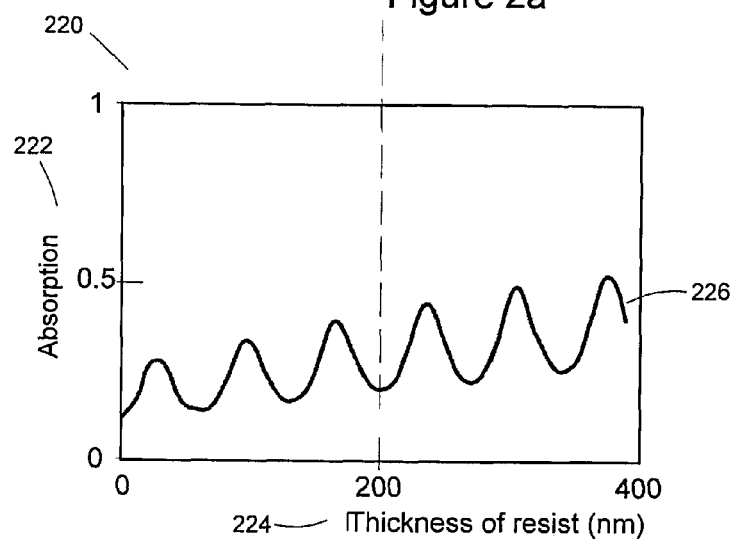
Figure 2b
Figure 2

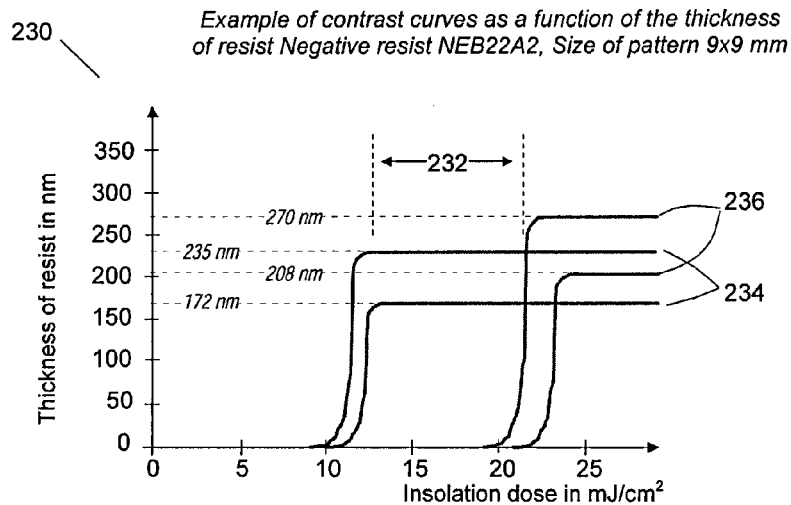
Figure 3a
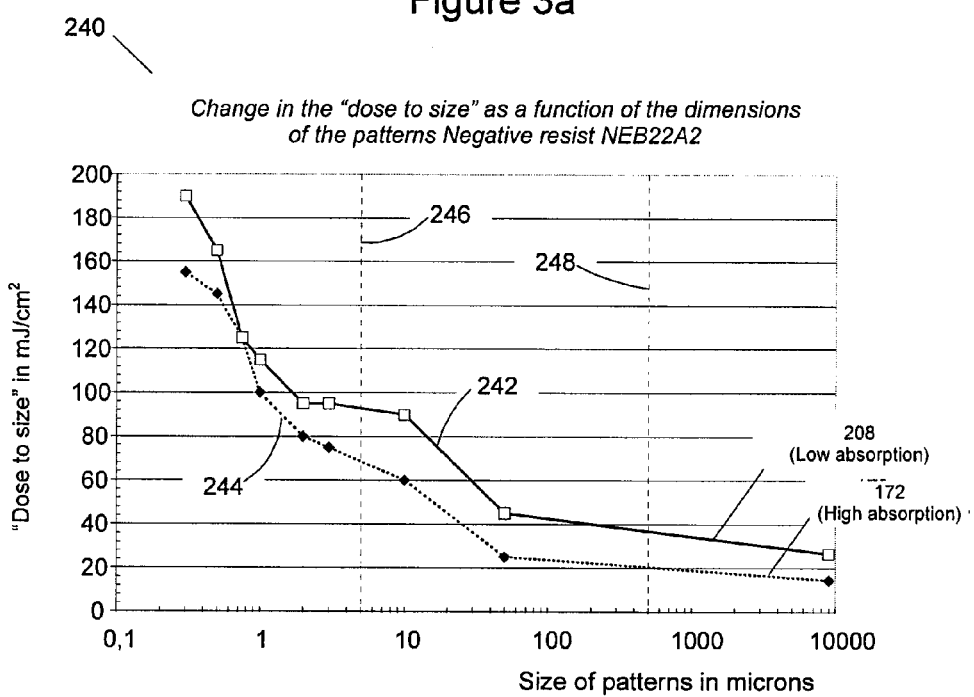
Figure 3b
Figure 3

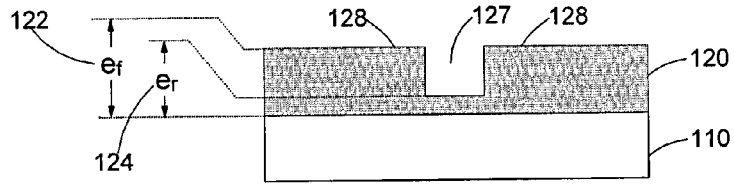
Figure 4a
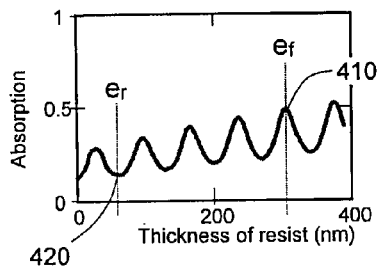 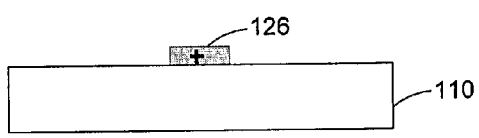
Figure 4b
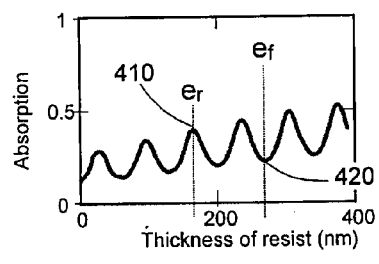 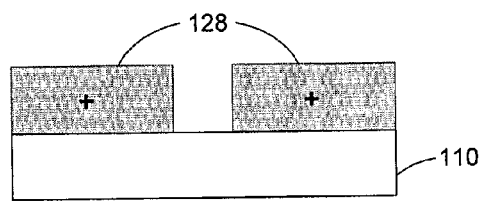
Figure 4c
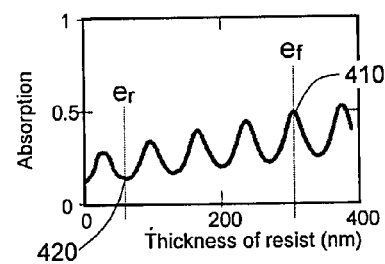 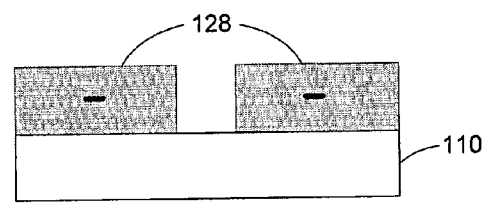
Figure 4d
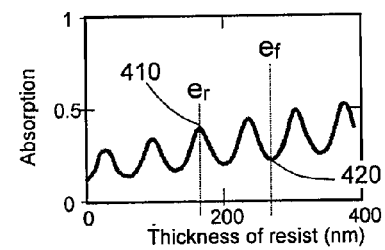
Figure 4e
Figure 4

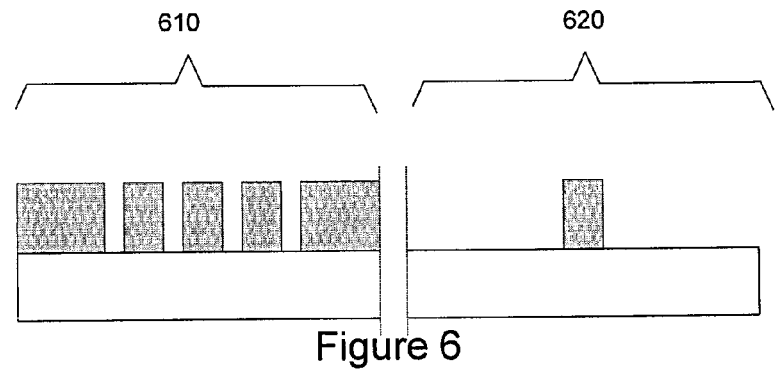
Figure 6
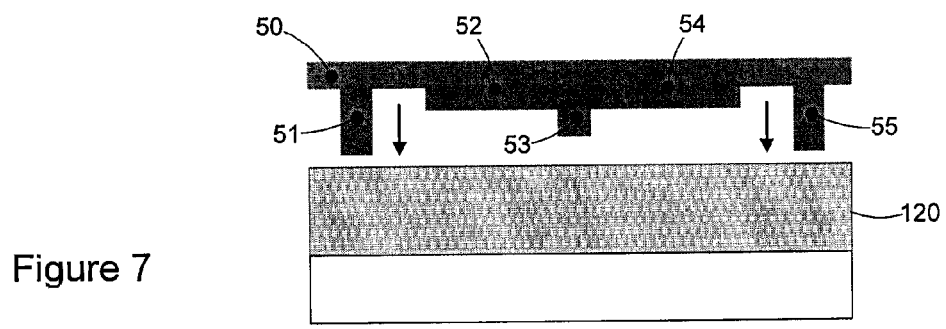
Figure 7
Figure 7a
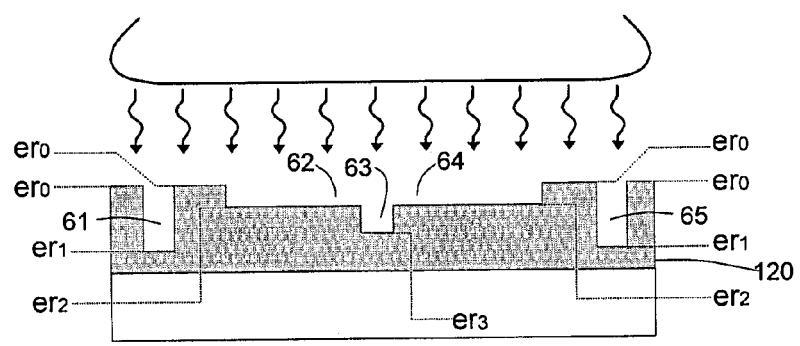
Figure 7b
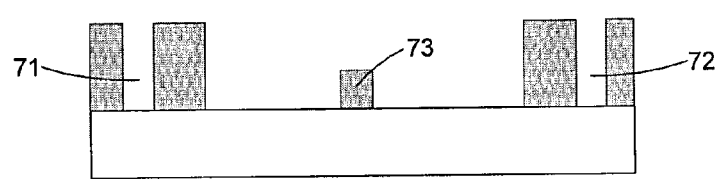
Figure 7c

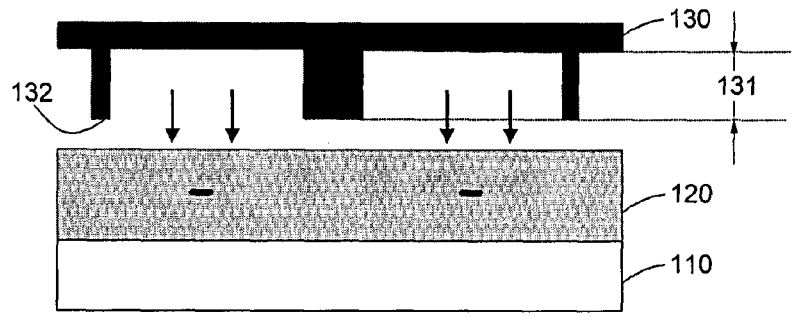
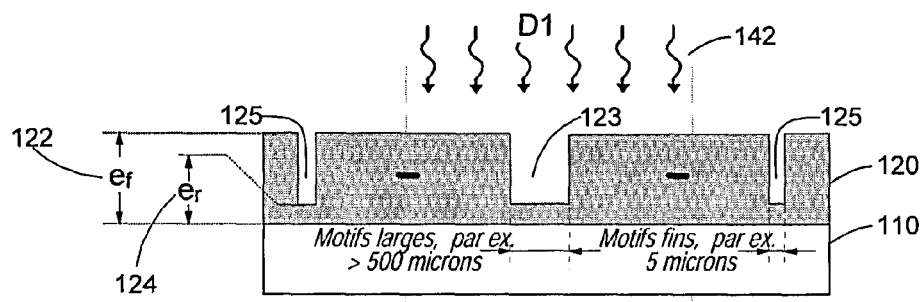
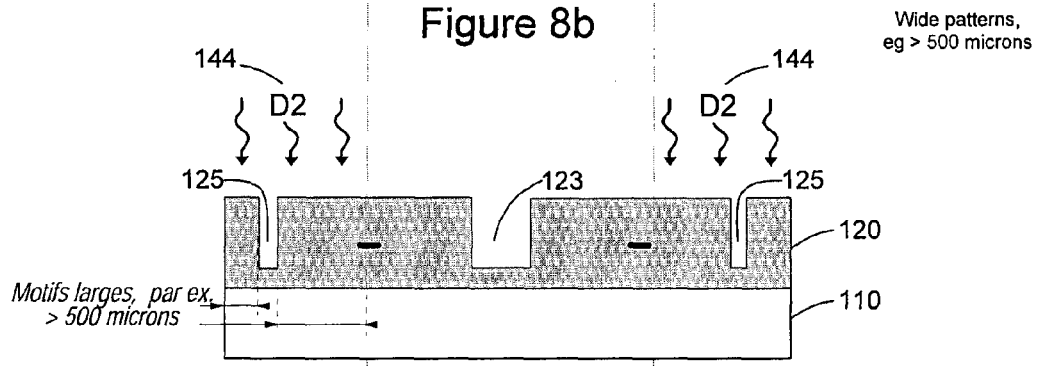
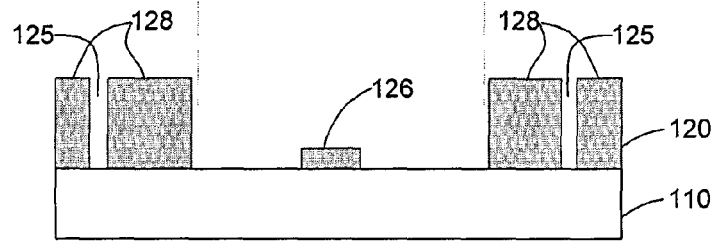
Figure 8

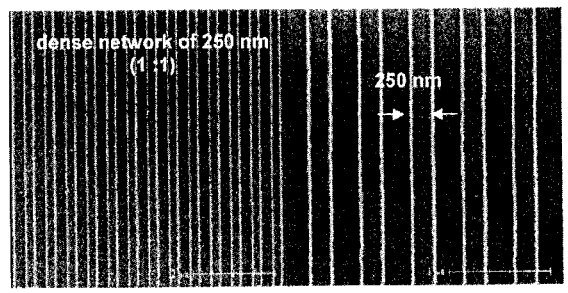
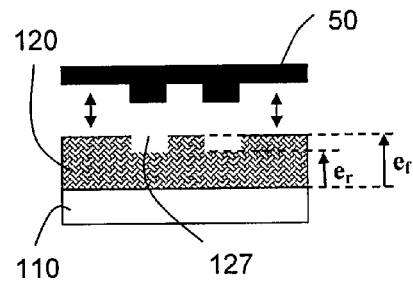
Figure 11a                    Figure 11b
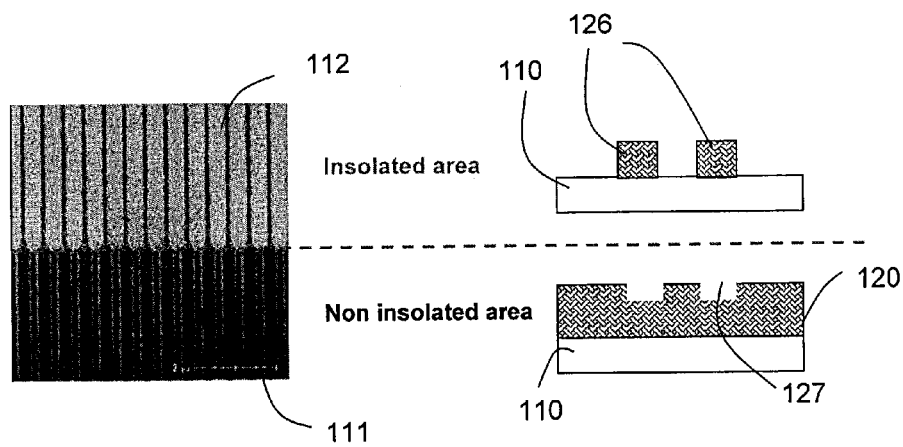
Figure 11c                    Figure 11d

NANOMETRIC IMPRINT LITHOGRAPHY METHOD

TECHNICAL FIELD OF THE INVENTION

The present invention concerns in general lithography methods. It receives as a favoured application the lithography methods used by the microelectronics industry for manufacturing semiconductor devices, in particular integrated circuits. It concerns more particularly an improved nanometric imprint lithography method.

PRIOR ART

The industrial manufacture of new generations of integrated circuits involves being able to etch patterns of ever smaller sizes, which are now measured in nanometers ($nm=10^{-9}$ meters) only. The photolithography used from the start, based on the insolation of photosensitive resists through optical masks reproducing the patterns to be etched, does however come up against physical barriers which require having recourse to more and more sophisticated techniques in order to be able to accompany the growth of the required integration density. In particular, in order to limit the diffraction of light through the masks, it is necessary to have recourse to shorter wavelengths (ultraviolet, or even X-rays) and complex techniques (for example immersion lithography), which require considerable investments for development and industrial implementation thereof.

In the middle of the 1990s a very different technique, which makes it possible in particular to completely overcome the diffraction problems mentioned above, was invented by Professor Stephen Y. Chou in the Nanometric Structures Laboratory of the University of Minnesota in the United States. The initial principle of this technique, known as "nanometric imprint lithography", was disclosed by him in several publications, including in particular the one entitled "Nanoimprint Lithography", published with his colleagues Peter R. Krauss and Preston J. Renstrom in the Journal of Vacuum Science and Technology, reference B 14(6), November/December. A technique which immediately aroused a great deal of interest and gave rise to numerous research and development works. Nanometric imprint lithography now forms part of the International Technology Roadmap for Semiconductors (ITRS) and more particularly for integrated circuit technologies in the course of development or in the production phase, the basic functional element of which, the node, was defined by the roadmap successively at 32 nm and 22 nm.

Nanometric imprint lithography comprises two main variants. The first, the one proposed originally by Professor Chou, thermal nanometric imprint lithography, normally referred to by its English acronym T-NIL, standing for thermal nanoimprint lithography, consists of imprinting, with an opaque mould, heated thermoplastic polymers or monomers. After cooling, the mould can be removed and the imprinted patterns remain in place.

The second technique, nanoimprint with photosensitive resist, normally referred to by its English acronym P-NIL, standing for photocurable nanoimprint, consists of imprinting a photosensitive resist with a transparent mould and effecting an optical insolation of the resist film through it. The insolation causes the hardening of the resist. As above, the mould can then be removed.

In both cases there does however remain a residue at the bottom of the nanoimprinted patterns that it is necessary to remove to enable them to be transferred onto the substrate that it is wished to etch. The use of nanometric imprint lithography therefore currently requires also needing to carry out reactive ion etching, normally referred to by the acronym RIE, in the presence of oxygen in order to remove the remaining residues present at the bottom of the nanoimprinted trenches. Another method consists of performing a post-etching step during which a controlled thickness of material is removed chemically. This step is normally referred to by the term etch-back.

These known techniques of removing the residue present in the bottom of the nanoimprinted patterns are relatively complicated, lengthy and expensive to implement.

The object of the invention is to propose an improved nanometric imprint lithography method that solves at least one of these problems.

SUMMARY OF THE INVENTION

The subject matter of the invention is thus a nanometric imprint lithography method comprising a preparation step during which a photosensitive resist is disposed on a substrate, and a step of pressing a mould in the resist in order to form at least one imprint pattern in the resist. The imprint pattern is at least partly delimited by two areas, including a pressed area and an area adjacent to said pressed area, said adjacent area being less or not at all pressed and having a thickness greater than that of the pressed area.

The method also comprises a step of exposing at least said two areas to an insolation dose. In other words, the two areas receive the insolation dose during this exposure step.

Characteristically, the respective thicknesses of said two areas are defined so that said two areas have a differential in absorption of the insolation dose and the insolation dose afforded by the exposure step is determined so as to be sufficiently great to activate the resist at whichever of said two areas has the highest absorption and so as not to be sufficiently great to activate the resist at whichever of said two areas has the lowest absorption. In other words, the thicknesses of said two areas are defined so that, to be activated, the resist at one of said two areas requires an insolation dose different from the insolation dose necessary for activating the resist at the other one of said two areas and the insolation dose afforded by the exposure step is determined so as to be sufficiently great to activate the resist at only one of said two areas.

Thus the thicknesses of resist and the insolation dose afforded by the exposure step are determined so that the insolation dose afforded is between the dose necessary for activation of the area having the highest absorption and the dose necessary for activation of the area having the lowest absorption.

Thus the invention takes advantage of the variation in the absorption of the film of resist according to the thickness of this film. This variation in absorption, normally considered to be a serious drawback, is used in the context of the invention to selectively activate the resist at the pattern or the area that surrounds it.

By using a positive resist, it is then for example possible to activate the resist only at the pattern in order to eliminate the residue after development of the resist. Likewise, by using a negative resist it is then possible to activate the resist only outside the pattern in order to eliminate the residue after development of the resist.

The invention thus makes it possible to eliminate the resist in the bottom of the patterns in a particularly precise and simple manner. It is possible in fact to dispense with the normally used steps of RIE or post-etching mentioned previously.

In addition, the method for removing the residue according to the invention makes it possible to obtain very good resolution of the patterns obtained by nanoimprint. This is because the steps of insolation and development of the resist preserve the slope of the nanoimprinted patterns unlike the steps normally used for removing the residue, which may alter the sides of the nanoimprinted patterns. In addition, these techniques tend to degrade the resist.

In a particularly advantageous manner, the invention also makes it possible to obtain, after development of the resist, a final pattern that is the reverse of that obtained by pressing of the mould in the resist. This final pattern corresponds to the protrusion of the mould.

This is because, with a positive resist, by choosing thicknesses of resist such that the adjacent area has an absorption greater than that of the highly-pressed area constituting the bottom of a pattern, the exposure makes it possible to activate only the adjacent area by making it soluble during development. After development, the adjacent area is therefore removed and the resist at the bottom of the pattern, which for its part has not absorbed a sufficient dose, for its part remains in place. A photograph that is the reverse of the patterns obtained by imprinting is then obtained. Likewise, with a negative resist, by choosing thicknesses of resist such that the adjacent area has an absorption less than that of the highly-pressed area constituting the bottom of the pattern, the exposure crosslinks the resist at the bottom of the pattern only. During development, the adjacent area is therefore removed and the resist at the bottom of the pattern, which for its part has not absorbed a sufficient dose, remains in place.

As will be detailed hereinafter, it is thus possible to easily obtain projecting final patterns corresponding to projecting protrusions of the mould. Advantageously, these projecting patterns may be narrow and may for example form lines.

In general terms in the context of the present invention, the patterns in the resist are hollow or projecting. Preferably, they are obtained by nanoimprint. The protrusions on the mould may also be hollow or projecting.

Optionally, the method according to the invention also comprises at least any one of the following features:

The thicknesses of resist are determined so that the difference between the dose necessary for activating the area having the lowest absorption and the dose necessary for activating the area having the highest absorption is at least 5 $mJ/cm^2$, for example 10 $mJ/cm^2$. Thus, if for a given resist the thickness of resist in an area requires a dose of 15 $mJ/cm^2$, a thickness would be chosen for the adjacent area such that, for this thickness, the minimum dose necessary for activation of the resist is approximately 20 $mJ/cm^2$. The insolation dose afforded by the exposure step will therefore have to be greater than or equal to 15 $mJ/cm^2$ and less than 20 $mJ/cm^2$. Preferably, contrast curves are defined to determine these thicknesses.

Preferably, the adjacent areas delimiting the same pattern formed during the step of pressing the mould receive the same insolation dose.

Advantageously, the absorption of the resist according to its thickness defines a substantially sinusoidal curve in which the thickness of the resist at one from said pressed zone and said adjacent zone corresponds to a maximum of said sinusoidal curve and the thickness of the resist at one from said pressed zone or said adjacent zone corresponds to a minimum of said sinusoidal curve.

According to a first embodiment, a final pattern corresponding to the protrusion of the mould is obtained. This final pattern is therefore the reverse of the pattern obtained by the imprint step.

According to an alternative of this first embodiment, the resist is a positive photosensitive resist, the thicknesses of the resist at the pressed area and at said adjacent area are determined so that the resist at the pressed area has an absorption lower than that of the resist at said adjacent area and in which the insolation dose afforded by the exposure step is defined so as to activate the resist at said adjacent area and to not activate the resist at the pressed area, so as to obtain a final pattern that is the reverse of the imprint pattern. Preferably, the adjustment of the thickness of highly-pressed resist corresponds to a minimum on the light energy absorption curve, the adjustment of the thickness of resist that is little or not at all pressed corresponds to a maximum on the light energy absorption curve.

According to another alternative of this first embodiment, the resist is a negative photosensitive resist, the thicknesses of the resist at the pressed area and at said adjacent area are determined so that the resist at the pressed area has absorption greater than that of the resist at said adjacent area and wherein the insolation afforded by the exposure step is defined so as to activate the resist at the pressed area and to not activate the resist at said adjacent area, so as to obtain a final pattern that is the reverse of the imprint pattern. This final pattern also corresponds to the protrusion of the mould. Preferably, the adjustment of the thickness of the highly-pressed resist corresponds to the maximum on the light energy absorption curve, the adjustment of the resist that is only slightly or not at all pressed corresponds to a minimum on the light energy absorption curve.

Thus, by virtue of the reversal, the invention makes it possible to easily obtain a final projecting pattern, such as a narrow line for example. In addition, the dimensions of this projecting final pattern may be very small and precisely controlled. However, with the known nanoimprint methods, obtaining the projecting patterns is particularly tricky. This is because obtaining them requires the presence of a hollow protrusion in the mould and it is very difficult to make the resist follow the form of a hollow protrusion in the mould. The presence of air in the hollow protrusion in the mould makes it even more tricky to obtain narrow projecting patterns.

Optionally, after development of the resist, an additional etching step is performed in order to remove any residue of resist remaining on the substrate at the adjacent area after the development step. Typically, these post-etching steps are steps of the RIE or etchback type.

According to a second embodiment, the residue of resist present in the bottom of the pattern obtained by the imprint step is eliminated.

According to an alternative of this second embodiment, the resist is a positive photosensitive resist, the thicknesses of the resist at the pressed area and at said adjacent area are determined so that the resist at the pressed area has an absorption greater than that of the resist at said adjacent area and wherein the insolation dose afforded by the exposure step is defined so as to activate the resist at the pressed area and to not activate the resist at said adjacent area, so as to eliminate the residue of resist at the pressed area, that is to say typically in the bottom of the imprint pattern. Preferably, the adjustment of the thickness of the highly-pressed resist corresponds to a maximum on the light energy absorption curve, the adjustment of the thickness of resist that is only slightly or not at all pressed corresponds to a minimum on the light energy absorption curve.

According to an alternative of this second embodiment, the resist is a negative photosensitive resist, the thicknesses of the resist at the pressed area and at said adjacent area are determined so that the resist at the pressed area has an absorption lower than that of the resist at said adjacent area and wherein the insolation dose afforded by the exposure step is defined so as to activate the resist at said adjacent area and to not activate the resist at the pressed area, so as to eliminate the residue of resist at the pressed area, that is to say typically in the bottom of the imprint pattern. Preferably, the adjustment of the thickness of the highly-pressed resist corresponds to a minimum on the light energy absorption curve, the adjustment of the thickness of resist that is only slightly or not at all pressed corresponds to a maximum on the light energy absorption curve.

Opposite or significantly different degrees of opening for two areas of the same wafer are obtained.

In a first embodiment, after the pressing step, a plurality of imprint patterns are obtained having different thicknesses, at least one of these thicknesses corresponding to a maximum absorption, and at least one other of these thicknesses corresponding to a minimum absorption. In more general terms, these thicknesses correspond to different absorption levels. Thus, by exposing the whole of the resist, it is possible to make the residues of resist situated in the bottom of the imprint patterns disappear and at the same time to obtain an image that is the reverse of other imprint patterns.

Advantageously, a full-wafer exposure is carried out.

In order to obtain, after the pressing step, imprint patterns having variable thickness, it is possible to provide for the mould to have projecting protrusions of different heights.

The invention is not limited to a single pressing step for obtaining areas of resist of different thickness on the same substrate.

Advantageously, the method also comprises a step of removing the mould after the pressing step. Preferably, the exposure is carried out after removal of the mould. In a variant embodiment of the invention, it can be carried out before the removal of the mould, the latter then being configured so as to allow the insolation dose to pass, at least partially. In this variant, the mould is preferably substantially transparent.

In another embodiment, alternative or combined with the first embodiment, portions of resist are insolated with different insolation doses. The exposure is thus effected unevenly over the whole wafer. These differences in exposure can be obtained by means of a mask partly blocking the exposure.

Preferably, at least a first pattern having a first dimension is insolated with a first insolation dose. Said dimension is taken in a direction normal to the thickness of the resist and corresponds typically to the width of a trench or a step formed in the resist. At least a second pattern having a second dimension smaller than said first dimension is insolated with a second insolation dose greater than said first insolation dose. More precisely, the exposure step is performed so that the first insolation dose is sufficient to activate only one from the pressed area or the area of the first pattern that is less or not pressed so that the second insolation dose is insufficient to activate the second pattern but is sufficient to activate the area bordering the second pattern. The second pattern may be a trench, in which case the areas bordering the pattern are areas having a greater thickness of resist. The second pattern may also be a projection, in which the areas bordering the pattern are areas having a lower thickness of resist. According to an alternative to this embodiment, during the exposure step all the resist is exposed to the insolation dose. The invention thus allows a full-wafer exposure, which is particularly advantageous in terms of cost and speed.

The insolation dose is provided by a coherent light source that generates interference phenomena in the film of resist. This generates the absorption differential that the invention takes advantage of.

Preferably, the exposure step involves successively several light sources having different wavelengths so as to increase the absorption differential.

Preferably, during the preparation step, a step is provided during which the photosensitive resist is deposited on a layer or substrate for amplifying the variations in absorption of the resist according to its thickness. Typically, said layer or said substrate are taken from the following materials: SiC, Ge, Ag, W, ALSi. Alternatively, to achieve this same objective of amplification of the variations in absorption, a silicon substrate can be provided.

Another subject matter of the invention is a multilayer assembly comprising a substrate covered with a layer of photosensitive resist, the resist having at least one pattern, delimited at least partly by two areas, namely a pressed area and an area adjacent to said pressed area. The thickness of each of the two areas corresponds to a maximum or a minimum of the absorption curve of said resist according to its thickness.

In more general terms, the thickness of each of the two areas corresponds to activation thresholds distant by at least 5 mJ/cm². Thus the minimum dose for activating one of the areas is at least 5 mJ/cm² less than the minimum dose for activating the other one of the areas, for example 10 mJ/cm² less.

BRIEF DESCRIPTION OF THE FIGURES

Other features, details and advantages of the invention will emerge more clearly from the detailed description given below by way of indication, in relation to drawings, in which:

FIG. 1 illustrates the steps of an example of a nanometric imprint lithography method according to the invention.

FIG. 2 illustrates the dependency of the insolation parameters vis-à-vis the thickness of the layer of deposited resist.

FIG. 3 illustrates, with examples, the behaviour of the photosensitive resists according to parameters including the insolation dose received and the size of the insolated patterns.

FIG. 4 describes four variants for implementing the invention, with a positive and negative resist, and making the two thicknesses of resists obtained after imprint correspond to different levels of absorption of the insolation energy, typically either to a maximum or to a minimum absorption.

FIG. 6 illustrates different lithography areas, those where narrow trenches must be opened in the resist, and others where on the contrary only narrow lines must remain.

FIG. 7 describes an example of application of the invention wherein a mould with variable topography is used, that is to say one having protrusions of variable heights.

FIG. 8 describes another example of application of the invention where the dose is varied according to the type of pattern in the area to be insolated.

FIGS. 11a to 11e illustrate an example of a method according to the invention for effecting a reversal of patterns.

Figure 5:
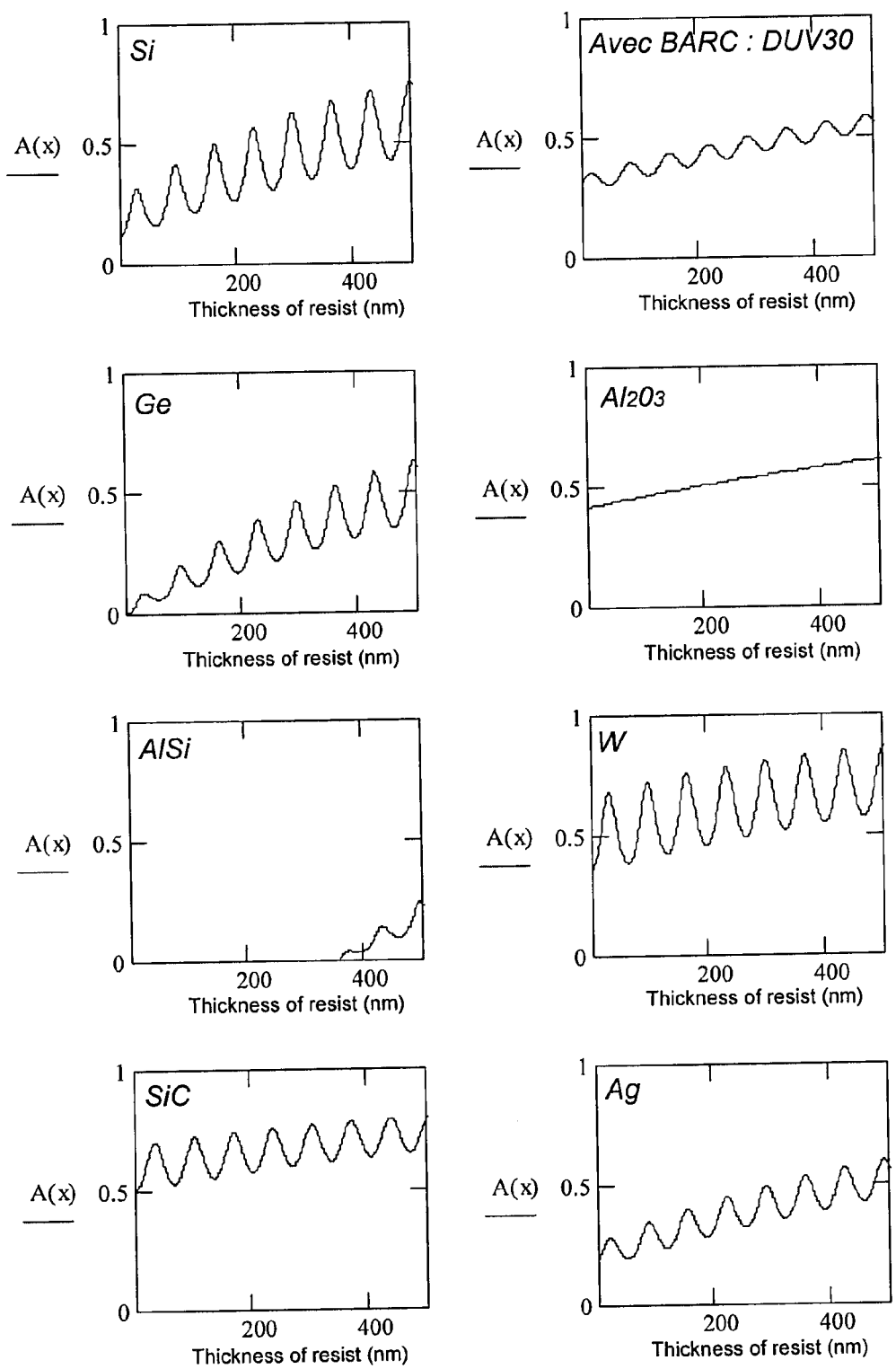
FIG. 5 illustrates the influence of the substrate or material situated under the layer of resist for implementing the invention.

The accompanying drawings are given by way of examples and are not limitative of the invention.

DETAILED DESCRIPTION OF THE INVENTION

FIG. 1, which comprises FIGS. 1a to 1e', illustrates the steps of the improved nanometric imprint lithography method of the invention.

On the substrate 110 where, on the surface, it is wished to reproduce and etch patterns that will contribute to the production of a device being manufactured, a layer of a photosensitive resist 120 is deposited, for example, of the type used in a standard manner by the microelectronics industry for optical lithography. The invention makes no assumption on the type of substrate by which the method of the invention is implemented. In particular, the substrate may for example already comprise numerous layers (not shown) on the surface, in which patterns may already have been previously defined, with the method of the invention, or by other means in particular using conventional optical lithography or electronic lithography.

As shown in FIG. 1a, the first step 101 therefore consists of depositing on the surface a layer of resist preferably controlled for thickness. The deposition can be done by any standard means used by the microelectronics industry. Usually, in this case, by centrifugation, a method often referred to as spin-coating. The thickness of the deposited layer is controlled by adjusting the speed of rotation according to the viscosity of the resist. After spreading, the resist in general undergoes heat treatment to discharge the solvent residues and to stabilise the resist mechanically. This treatment may for example be of the type normally referred to as soft bake.

As shown in FIG. 1b, the following step 102 consists of pressing in the resist a mould 130 having protrusions 132. The pressing of the mould 130 makes the protrusions 132 penetrate the resist 120, which transfers these protrusions 132 in order to form nanoimprinted patterns in the resist. Advantageously, the mould can be applied over the entire surface of the substrate and can therefore reproduce all the patterns of all the devices produced simultaneously on a wafer made for example from a semiconductor material. Typically, the wafer is made from silicon. It may be very large, for example several tens of centimeters, compared with the patterns of nanometric sizes to be reproduced. For simplicity, without this in any way interfering with the understanding of the method of the invention, only one of these projecting protrusions 132 is shown whereas a very large number, typically hundreds of thousands, may in reality have been fashioned on the bottom surface of the mould. The mould may be produced from an opaque, transparent or partially transparent material.

As will be seen subsequently, the height 131 of the protrusions 132 projecting on the mould and/or the thickness 121 of the layer of resist deposited are important parameters for controlling the implementation of the method of the invention.

In the present application, the height of the protrusions or the thickness $e_r$, $e_f$, $e_0$, $e_1$, $e_2$, $e_3$ of resist 120 means dimensions taken in directions substantially perpendicular to the principal plane of the substrate and/or substantially parallel to the direction of penetration of the mould 130 in the resist 120.

Preferably, while the mould 130 is pressed in the resist 120 and remains in place, the substrate 110, which rests on a support (not shown), is heated to facilitate the imprinting by making the resist more malleable: for this purpose a temperature around the glass transition temperature of the resist is used. The heating temperature must be such that it no way impairs the photosensitive qualities of the resist used. In particular, in the case of so-called positive resist, the heating temperature must remain below the so-called deprotection temperature thereof. In the case of a so-called negative resist the heating temperature must remain below the cross-linking temperature. According to circumstances, positive and negative resists are in fact normally used in lithography so that the parts exposed to light become respectively soluble or insoluble after insolation, making it possible to reproduce the patterns of the masks or their negatives.

At the following step 103, as shown in FIG. 1c, it is then possible to proceed with the removal of the mould 130. The printed patterns 127 remain in place in the layer of resist 120.

The following step 104 is illustrated by FIG. 1d. Insolation of the imprinted resist 120 is then carried out. Preferably, this insolation is effected over the whole of the surface of the resist. This full-wafer insolation simplifies and accelerates the method of obtaining the patterns. According to a variant, only a portion of the resist is insolated. This localised exposure can be obtained by means of a mask partly obscuring the insolation of the resist. The insolation given to the resist, at least at some of the patterns, is referenced 140 in FIG. 1d. It is clear in this figure that the adjacent areas 128, 129 delimit a pattern 127 receiving the same insolation dose during the exposure step.

The invention is based on the observation that the behaviour of the resist may be very different at the end of the insolation phase according to its thickness. The behaviour after insolation depends on the insolation dose absorbed. However, the dose absorbed depends on the absorption ability of the resist, which itself depends on the thickness of the resist. For a given pattern, two thicknesses are to be considered. That of the resist that has been significantly pressed by the mould. This area 129 corresponds to the projecting protrusions 132 of the mould 130, that is to say: $e_r$ 124; and the greater thickness of the resist, where it has been only slightly or not at all pressed by the reliefs 132 of the mould 130. This area 128 corresponds to the hollows generated by the protrusion 132 on the mould 130. This area 128 is designated hereinafter as the area 128 adjacent to the pattern. Its thickness is referenced: $e_f$ 122 in FIG. 1d.

Thus, if a mould has stepped protrusions, a first area adjacent to a pressed area may itself constitute a pressed area delimited by a second adjacent area not pressed or less pressed than the first one. Such is the case with the protrusions 52 and 54 illustrated in FIG. 5 and described hereinafter.

In the present invention, pressed, deformed, packed or compressed area and less or not pressed, deformed, packed or compressed area will be spoken of in order to characterise the difference or differences in thickness caused by the penetration of the mould in the resist. This penetration of the mould in the resist generates at least two adjacent areas, one having a thickness greater than that of the other area. Thus the present invention covers both elastic and inelastic deformations of the resist, that is to say deformations with or without significant compression of the resist.

In the case where the adjacent area is not pressed by the mould, its thickness corresponds substantially to the thickness of resist deposited during the first step 101. If the total surface of the protrusions is great there may be a significant reflux of the resist in the only slightly pressed areas and therefore an increase in the thickness of resist initially deposited. The thicknesses must be chosen accordingly, depending on the density and size of the patterns. Preliminary tests will advantageously be carried out in order to determine the effective thicknesses after pressing, which are those that are important for the choice of doses.

As will be seen in detail in the description and the figures that follow, the insolation dose provided during the insolation phase may be such, by adjusting the thicknesses $e_f$ and $e_r$, that the thicker parts remain or become effectively soluble during the development phase whereas, respectively, the compressed parts become or remain insoluble according to the type of resist used, that is to say negative or positive.

This makes it possible to obtain, with the method of the invention, for example the result illustrated in FIG. 1e or 1e' at the end of the step 105 of development of the resist after insolation. In the case illustrated in FIG. 1e, the residue of resist situated in the bottom of the pattern 127 absorbs an insolation dose that causes its shrinkage after development whereas the resist 128 adjacent to the pattern 127 remains in place.

In the case illustrated in FIG. 1e', there is obtained a transfer into the resist of the patterns 126 that correspond to the protrusions 132 on the mould whereas it is the reverse result that is obtained with the standard method where the RIE etching step mentioned in the chapter on the prior art on the contrary makes the resist that has been pressed disappear, in the place where it is therefore the thinner 124.

Thus, by effecting a reversal, it is easily possible to obtain a projecting final pattern. In addition, the dimensions of this projecting final pattern may be very small and precisely controlled. However, with the known methods of nanoimprinting, obtaining projecting patterns is particularly tricky.

FIG. 2, which is composed of FIGS. 2a and 2b, illustrates the above-mentioned dependency of the insolation parameters vis-à-vis the thickness of the layer of deposited resist.

The layer of resist 120 deposited constitutes, with the underlying substrate 110, a semi-transparent and semi-reflective optical system of the Fabry-Pérot interferometer type. The behaviour of the layer for the insolation operation is then dependent on its thickness. This is because the interference phenomena that appear in the film of resist give rise to a variation in the energy absorbed thereby. Because of this, the optimum insolation dose, which transforms the chemical structure of the resist so that it becomes soluble or insoluble for the following development phase, varies according to its thickness. The diagram 210 is an example of characteristic data determined experimentally that shows this dependency. It is the case in this example of a negative resist the commercial reference of which is indicated 212. On the Y axis is the insolation dose necessary for the chemical transformation of the exposed resist. In the case of a negative resist, this energy dose, expressed here in millijoules per square centimeter, causes its cross-linking so that it becomes insoluble. The optimum dose for obtaining this result is usually designated by the term "dose-to-size" 214, that is to say the optimum dose that makes it possible to obtain, after development, the nominal size of the exposed patterns. The curve 218 shows the dependency of the optimum dose as a function of the thickness 216 of the resist. This curve, which is cyclic, typically sinusoidal, has a series of minima and maxima the repetition period of which depends on the wavelength of the coherent light source used, 248 nm in this case. The insolated patterns are squares with sides of 9 mm.

This phenomena of variation in the absorption of a film of resist may also be calculated using the model of the Fabry-Pérot interferometer already mentioned above. The diagram 220 shows the result of a simulation of the absorption 222, standardised in a range 0-1, of a film of resist as a function of its thickness 224 from the optical data of the resist supplied by the manufacturer. This simulation is carried out under conditions similar to those of the diagram 210, which makes it possible to compare the experimental curve 218 and the calculated curve 226 and to find, for example for a thickness of 200 nm, that the absorption minimum of the curve 226 does indeed correspond on the curve 218 to a maximum cross-linking dose to be given to the resist in order to obtain activation thereof. This is because the lower the absorption the more it is necessary to increase the insolation dose in order to obtain the same result. It is therefore expected that a minimum absorption corresponds to a maximum of the "dose-to-size" to be applied.

This large variation in the optimum dose to be applied as a function of the thickness of the resist deposited is unanimously considered to be a serious drawback by persons skilled in the art. To overcome this problem, recourse is often had to the deposition of supplementary layers (such as those referred to as BARC ("bottom anti-reflective coating") in order to prevent or minimise any reflection from the substrate by depositing thereon, prior to the layer of resist; this layer will not reflect the incident light and attenuates the amplitude of the sinusoids 218. A number of techniques such as the deposition of a non-reflective surface coating, usually referred to as "top anti-reflective coating", have been developed to reduce the undesirable consequences of the variation in absorption.

The invention on the contrary takes advantage of this phenomenon to propose the method described in FIG. 1, a method that can be implemented in four different ways as explained in FIG. 4 below.

Prior to this description, FIGS. 3a and 3b give additional information on the behaviour of the photosensitive resists according to parameters such as the thickness of the deposited resist, the insolation dose received and the size of the insolated patterns, and which are useful to an understanding of the method of the invention.

The diagram 230 shows an example of experimental determination of a dose window 232 that produces opposite results after insolation according to the thickness of resist in question. It is found for example on its curves, referred to as contrast curves, that a dose of 15 mJ/cm$^2$, situated at the middle of the window 232, will be suitable for selectively activating the negative resist in question (NEB22A2), if it has a thickness of 172 nm or 235 nm 234, thicknesses for which the absorption is high. On the other hand it will not activate thicknesses of 208 nm or 270 nm 236, thicknesses for which the absorption is low. The entire range of doses included in the window 232 is able to suit. In this example the curves are established for square patterns with sides of 9 mm.

Another very important parameter that determines the choice of doses to be applied concerns the size of the patterns. The diagram 240 shows on the Y axis the change in the dose necessary for activating the resist, normally referred to by the term "dose-to-size", expressed in millijoules per cm$^2$ as a function of the dimension of the insolated patterns expressed in microns, that is to say $10^{-6}$ meters. The two curves correspond to two thicknesses of resist, one where the absorption is high 244, the other one where the absorption is low 242. Naturally the dose-to-size to be applied is greater for thicknesses of resist where the absorption is lower.

FIG. 4, which comprises FIGS. 4a to 4e, describes four variants for implementing the invention, with a positive and negative resist, and making the two thicknesses of resist obtained after imprinting correspond either to a maximum or to a minimum of the sinusoidal curve of absorption of the insolation light energy by the layer of resist.

In order to facilitate the disclosure of the invention, in all the examples that follow the thicknesses of resist correspond either to a maximum or to a minimum absorption. The invention is however not limited to thicknesses of resist corresponding to extrema. It encompasses all methods involving thicknesses of resist having differences in absorption sufficient to selectively activate the resist at the compressed area or at the adjacent area that is less or not compressed.

FIG. 4a shows the layer of resist imprinted at the end of the step 103 of the method as described in FIG. 1. At this stage four variant embodiments are possible, which are described below in FIGS. 4b to 4e.

FIG. 4b illustrates a first variant in which the resist used is positive and where a reversal of the nanoimprinted patterns 127 is obtained, that is to say a transfer into the resist of the projecting protrusions 132 of the mould 130, as described in FIG. 1e'. To obtain this result, that is to say to obtain the patterns 126, it is necessary for the thickness of the pressed resist $e_r$ to be adjusted to a minimum absorption 420 on the sinusoidal curve described in FIG. 2b. Conjointly, it is necessary for the thickness of the resist $e_f$ that is not or only a little pressed by the protrusions on the mould to be adjusted to a maximum absorption 410 of the sinusoidal curve. In more general terms, it is necessary for the thickness of resist in the bottom of the pattern to correspond to a significantly lower absorption than that in the area 128 adjacent to the pattern. Thus, by adjusting the optimum insolation dose or "dose-to-size" to this maximum absorption 410 a sufficient dose is not given to the most pressed parts of the resist to transform them chemically. In the case of a positive resist the dose is then insufficient to make it soluble to development and the patterns 126 remain in place for the operation of etching the substrate that follows. As already noted in FIG. 1, this first way of operating makes it possible to obtain a transfer of the protrusions 132 projecting on the mould 130, unlike a standard nanometric imprint lithography operation where it is the compressed parts of the resist, those which in this case are generally referred to residues, that are removed by a following RIE etching operation. This first implementation of the invention on the contrary advantageously uses these most pressed parts or residues for effecting a pattern reversal.

FIG. 4c describes a second variant embodiment that makes it possible to obtain, still with a positive resist, the opposite result. In this case, as with a standard nanometric imprint lithography operation, it is the non-pressed parts 128 of the resist, those that correspond to the protrusions 132 forming a hole in the mould, that remain in place. This result is obtained by adjusting the thickness of the pressed resist $e_r$ to a maximum absorption 410 on the sinusoidal curve. Conjointly, it is necessary for the thickness of the resist $e_f$ not pressed by the protrusions on the mould to be adjusted to a minimum absorption 420. In more general terms, it is necessary for the thickness of resist in the bottom of the pattern to correspond to an absorption significantly greater than that in the area 128 adjacent to the pattern. Thus, as above, by adjusting the optimum insolation dose or "dose-to-size" to this maximum absorption 410, it is to the non-pressed resist parts that this time a sufficient dose to transform them chemically is not given. The resist being positive, it is initially insoluble, and the less absorbent adjacent areas 128 will therefore remain in place during development.

It will be noted that this second embodiment makes it possible to eliminate the pressed parts or residues without having recourse to an RIE etching as is necessary in a standard nanometric imprint lithography operation. Particularly advantageously, the invention makes it possible to keep the slope of the patterns and thus offers improved resolution compared with existing methods involving a subsequent etching step during which the sides of the patterns 127 may be significantly degraded during the etching.

FIGS. 4d and 4e are dual figures of the previous two figures. They respectively describe the third and fourth variant embodiments of the invention using this time a negative resist. What was stated for FIGS. 4b and 4c applies. Only the result obtained is reversed because of the use of a negative resist, which is therefore initially soluble, and some parts of which are made insoluble by exposing them to an optimum dose of light determined by a maximum 410 of the sinusoidal absorption curve 226.

Thus, with a negative resist for FIG. 4d, the resist situated in the bottom of the patterns 127, that is to say here the resist of the pressed area 129, has a height such that its absorption is weaker than the absorption of the area 128 adjacent to the pattern 127. The exposure is therefore carried out so that:
  the resist situated on said adjacent area 128 absorbs a dose sufficient for its activation. It therefore remains in place after development.
  the resist situated in the bottom of the pattern 127 absorbs a dose insufficient for its activation. It will therefore be removed at the time of development.

The invention thus makes it possible, with a negative resist, to remove the residues at the bottom of the patterns without having recourse to the existing RIE or post-etching (etchback) steps.

Conversely, with a negative resist for FIG. 4e, the resist situated in the bottom of the patterns 127 has an absorption such that its absorption is greater than the absorption of the area 128 adjacent to the pattern 127. The exposure is therefore carried out so that:
  the resist situated in the bottom of the patterns 127 absorbs a dose sufficient for its activation. It therefore remains in place after development.
  the resist situated in said area 128 adjacent to the pattern 127 absorbs a dose not sufficient for its activation. It is therefore removed at the time of development.

The invention thus makes it possible, with a negative resist, to easily reverse the patterns 127 obtained by nanoimprinting. It then makes it possible to obtain patterns similar to the protrusions 132 on the mould 130.

Concerning the general implementation of the invention, the following remarks apply:
  The optical properties of the resist, of the substrate and more particularly of the resist/substrate interface will advantageously be adapted to adjust the method of implementation to a particular application and/or to broaden its window of application. The conditions of the optical insolation, in particular the wavelength of the optical source but also, to a lesser extent, the optical opening, the illumination, the depth of field and the angle of incidence, are to be considered.
  The substrate, or the material placed under the resist, has a very great influence on the absorption of the film of resist according to its thickness. In the light of the simulation results shown in FIG. 5, it can be seen that some materials are more favourable than others, for example SiC, Si, Ge, Ag, AlSi and W offer the possibility of having a high difference in absorption between two thicknesses of resist. As in the diagrams of the previous figure, it is the standardised absorption that appears on the Y axis as a function of the thickness of resist expressed in nm.
  In order to obtain particularly advantageous application conditions, it is preferable to adjust the thickness of the highly-pressed resist parts and those that are less so or not at all. To this end, as shown in FIGS. 1a and 1b, it is possible to act first on the thickness 121 of the layer of resist initially deposited, and secondly on the height 131 of the projecting protrusions on the mould. This so that the thickness of the pressed resist parts and those that are less so or not at all correspond as exactly as possible to the minima and maxima chosen on the sinusoidal absorption curve 226.

The resists used are photosensitive resists, for example chemical-amplification resists conventionally used in microelectronics, for example the resist normally referenced CAP 112 and marketed by the Japanese company TOK, which must also be able to preserve without deformation the imprint of the mould and without the heating undergone during this operation impairing their photosensitive properties.

If a chemical-amplification resist is used, it is necessary to pay attention to the temperatures and pressures applied during pressing. The pressing temperature must remain lower than the thermal cross-linking temperature of the resist, which is dependent on the pressure applied to the film of resist.

In order to generate interference phenomena in the film of resist, a coherent light source can be used, that is to say one having a given wavelength, such as a laser or a UV lamp provided with a suitable filter.

It is also possible to use filtered polychromatic sources or ones having a restricted spectrum width, typically less than 200 nm. It is also possible to use sources with several clearly distinct wavelengths, or to involve several light sources successively for effecting the insolation of the resist if these various wavelengths make it possible to increase the absorption differential.

All the sources normally used for optical lithography may suit. It is possible for example to use a mercury lamp, normally referred to as a Mercury Arc Lamp, filtered to obtain an intensity peak for a specific wavelength. Typically, it is possible to use a mercury lamp configured to have an intensity peak situated at a wavelength of 436 nm or 405 nm or 365 nm. Then G-line lithography refers to a wavelength of 436 nm, H-line lithography to a wavelength of 405 nm and I-line lithography to a wavelength of 365 nm. It is also possible to use an excimer or exciplex laser (KrF, ArF, $F_2$, etc.). The source and its wavelength must be chosen according to the sensitivity of the resist used.

If, as has been seen, the optimum insolation dose or "dose-to-size" that makes it possible to obtain a pattern of nominal size varies according to the thickness of the film of resist, this optimum insolation dose must also be adapted according to the dimensions and/or configuration of the patterns to be produced. In general terms the optimum dose increases when the dimensions of the patterns, lines and spaces decrease. Consequently, it is easier to effect a lithography that is the reverse of that which is obtained by performing a standard nanometric imprint lithography operation, by using a positive resist, as is shown in FIG. 4*b*. In the same way, it is easier to eliminate the highly-pressed parts of a resist, the residues, by using a negative resist as illustrated in FIG. 4*d*.

This is because the bottom of the pattern has a very small size, which increases the optimum dose to be given to this pattern in order to be activated. The difference in optimum dose between the bottom of the pattern and the area adjacent to the pattern is therefore large. This facilitates the activation of the adjacent area without activating the bottom of the pattern.

In the case of a positive resist, the bottom of the pattern, the resist of which is not activated, then remains in place. Then a pattern reversal is obtained, which forms for example a line as illustrated in FIG. 4*b*.

In the case of a negative resist, the bottom of the pattern is not activated and disappears during development. The residue is therefore removed, which forms a trench as illustrated in FIG. 4*d*.

Depending on the conditions used (resist, substrate, patterns to be produced, etc.), it is possible that a residue of resist may be present on the reverse image of the nanoimprint lithography (the case where the resist thicknesses are reversed). In this case, it suffices to remove the residue using the techniques normally employed for nanoimprint lithography and indicated previously.

Thus, in summary, applying the method according to the invention corresponding to the first and fourth variant, as illustrated respectively by FIGS. 4*b* and 4*e*, makes it possible to reverse the image produced by a nanometric imprint mould, that is to say makes it possible to transfer the protrusions projecting from the mould directly into the resist.

Moreover, applying the method corresponding to the second and third variant, as illustrated respectively by FIGS. 4*c* and 4*d*, makes it possible on the other hand to eliminate the parts of the resist situated in the bottom of the patterns 127 obtained by nanoimprint, that is to say the resist parts being greatly pressed by the reliefs 132 projecting from the mould. These two variants thus offer an alternative to the standard nanometric imprint lithography operation where the pressed parts, usually designated as being residues, are removed during a subsequent etching operation. The method of the invention thus offers the advantage of preserving the dimensions of the resist patterns very well.

Finally, it should be noted that the method of the invention makes it possible to carry out, simultaneously, lithographies with opposite or significantly different degrees of opening on the same layer of resist. The degree of opening of a given area of a wafer means the ratio between the surface of the resist left in place in this area and respectively the resist surface in which the hollow patterns are produced during imprinting in this same area. As shown in FIG. 6, lithographies comprising both areas where a narrow trench must be opened in the resist 610, and others where on the contrary only narrow lines 620 of resist should remain. As indicated previously, obtaining narrow final projecting patterns, such as lines, are particularly tricky with the known nanoimprint methods. In general terms, in lithography, holes and narrow trenches are produced with a positive resist. This is for example the case with vertical interconnections or vias between different metallisation levels. As for the lines and networks of lines, which comprise for example the active areas and gates of transistors, these are produced with a negative resist. This involves two different resists and therefore two successive series of steps of spreading the resist, insolation and development. In addition, this means that different masks must then be used, considerably increasing the cost. This is not the case with the method of the invention, which makes it possible to treat the two types of area simultaneously as in the two examples of application of the invention described below.

This possibility offered by the invention of being able to obtain opposite or significantly different degrees of opening for two areas of the same wafer is particularly advantageous in applications such as the manufacture of micro or nano electromechanical systems (NEMS) or optical devices.

FIGS. 7 and 8 illustrate examples and embodiments of the invention for obtaining opposite degrees of opening on the same wafer, that is to say projecting narrow final patterns at certain points and hollow narrow final patterns at other points.

FIG. 7, which comprises FIGS. 7*a* to 7*c*, describes an example of application of the invention where a variable-topography mould 50 is used, that is to say one comprising projecting protrusions 51, 52, 53, 54, 55 of different heights.

Pressing the mould 50 in the resist 120 transfers the imprint of the protrusions 51, 52, 53, 54, 55 in order to form the patterns 61, 62, 63, 64, 65. The patterns 61, 62, 63, 64, 65 have the thicknesses $er_1$, $er_2$, $er_3$, $er_2$ and $er_1$, respectively as illustrated in FIG. 7b.

The area adjacent to these patterns, that is to say where the resist has been pressed less or has not been pressed, has a height $er_0$.

The resist 120 is then exposed. This figure illustrates that the adjacent areas delimiting a pattern receive the insolation dose.

The result after development of the resist is illustrated in FIG. 7c.

The final result shows trenches 71, 72 at the bottom of which the residue of resist has been removed during the development. These trenches correspond to the reliefs 51, 55 of the mould 50.

This same final result shows final patterns 73 reversed with respect to the patterns obtained by nanoimprint. The pattern 73 thus forms a line in accordance with the protrusion 53 on the mould 50.

With the same mould, there are thus obtained both at some points a reversal of patterns obtained by imprint and at other points a disappearance of the residues at the pattern bottom. This result can be achieved with a single exposure step. The invention thus considerably simplifies the known methods for integrated circuits.

This final result may be obtained with a positive resist. In this case, the thicknesses $er_0$, $er_1$, $er_2$, $er_3$ will be chosen so that $er_0$ and $er_3$ correspond to a minimum absorption and $er_1$ and $er_2$ correspond to a maximum absorption.

More generally, it is necessary for the absorptions corresponding to the thicknesses $er_0$ and $er_3$ to be significantly lower than those of the thicknesses $er_1$ and $er_2$. An absorption difference of 5 mJ/cm² is sufficient. This difference offers in fact a sufficiently wide method window. A greater difference, greater than 10 mJ/cm², will make it possible to significantly increase this window.

This final result can be obtained with a negative resist. The thicknesses $er_0$, $er_1$, $er_2$, $er_3$ will then be chosen so that $er_1$ and $er_2$ correspond to a minimum absorption and $er_0$ and $er_3$ correspond to a maximum absorption.

More generally, it is necessary for the absorptions corresponding to the thicknesses $er_1$ and $er_2$ to be significantly lower than those of the thicknesses $er_0$ and $er_3$.

FIG. 8, which comprises FIGS. 8a to 8d, describes another example of application of the invention where the dose is varied according to the type of patterns of the area to be insolated.

In this case, as illustrated in FIG. 8a, the height 131 of the projecting protrusions 132 may be identical over the entire surface of the mould 130. The imprinting of the resist is done as described previously. Non-limitatively, the resist is of the negative type in this example. The result of the imprinting is shown in FIG. 8b. As in FIG. 1, two thicknesses of resist are to be considered: the thickness $e_r$ 124 of the areas of resist pressed by the protrusions 132 projecting from the mould, and the thickness $e_f$ 122 of the areas of resist that are less or not pressed. In this example of application of the invention the thickness $e_r$ is adjusted so as to have high absorption, and for example to correspond to a maximum of 410 of the sinusoidal absorption curve 226. The thickness of the non-pressed parts $e_f$ is for its part adjusted so as to have low absorption and for example to correspond to a minimum 420 of this curve.

This application of the invention is characterised in that two successive insolations will be carried out. The first insolation 142, corresponding to a dose D1, is limited to the areas containing relatively wide open patterns, for example 123. As seen above, the thickest area of insolated resist corresponds to an area of low absorption and that of the compressed parts to high absorption. The dose D1 is therefore adjusted to allow cross-linking of the compressed insolated areas but is not sufficient to cause the cross-linking of the thick insulated areas where the energy absorption is lower. As will be seen in FIG. 8d, it is the pressed parts 126 that will therefore remain in place after development of the resist. Negative resist in this example, which is initially soluble, and which remains where an insufficient dose is applied.

By way of practical example, if the diagram 240 in FIG. 3b is referred to again, the thickness $e_f$ 122 can be chosen so as to be equal to 208 nm and to correspond to the low-absorption curve 242. The pressed parts are then of thickness $e_r$ 124 equal to 172 nm. They correspond to the high-absorption curve 244. For the parts where the patterns to be etched are wide, for example around or greater than 500 microns, like the pattern 123 in FIG. 8b, it can be seen on the diagram 240 in FIG. 3b for this size of pattern 248 that a dose D1 of 20 mJ/cm² is sufficient to activate the resist in the highly-pressed area 123 but is not sufficient to activate the resist in the less pressed areas. This is suitable for obtaining, in this first insolation area, the result shown in FIG. 8d.

The invention does not make any assumption on the way in which the areas containing such and such a type of pattern are selected nor on the means used to insolate them selectively. A mask obscuring the exposure at certain points can for example be used.

As already noted previously, and as can be seen precisely on the diagram 240 in FIG. 3b, the optimum dose that it is necessary to apply increases when the dimensions of the patterns to be produced, lines or spaces, decrease. The dose 144 that will be applied to the areas of narrow patterns 125, that is to say D2, is therefore higher than D1. Which will this time allow the cross-linking of the thick resist parts 128. It will however remain insufficient for cross-linking the bottom of the narrow trenches 125 despite the fact that the thickness of the pressed parts is adjusted for a maximum absorption.

To continue the above practical example, still referring to the diagram 240 in FIG. 3b, the doses that it is necessary to apply for patterns of 5 microns, such as for example the pattern 125 in FIG. 8c, are appreciably higher, as can be seen at 246. In this example, a dose D2 of 40 mJ/cm² is however sufficient to insolate and activate the wide patterns of this second area without however sufficiently insolating the pressed areas at the bottom of the patterns such as 125. The latter, which will not remain after development of this negative resist since the dose applied will have been insufficient. In accordance with the curve 244, for this dimension 246, it would in fact have been necessary to apply a minimum dose of approximately 70 mJ/cm². The dose of 40 mJ/cm² is however sufficient to activate the wide patterns, in this example the patterns having a width greater than 500 microns, having a thickness of 208 nm, which corresponds to a low absorption and to the curve 242 for the lowest absorption.

The final result after development is the one shown in FIG. 8d where it has been possible to transfer into the resist, during the same operation, both wide patterns 126 and narrow trenches 125.

To execute the present invention, a person skilled in the art would without difficulty establish absorption curves for the resist used according to the thickness of this resist. By way of example, a method for determining the absorption curve for a layer of resist as a function of the thickness of this layer of resist is given below. This method can be applied to determine the curves illustrated in FIGS. 2b, 4 and 5.

Figure 9:
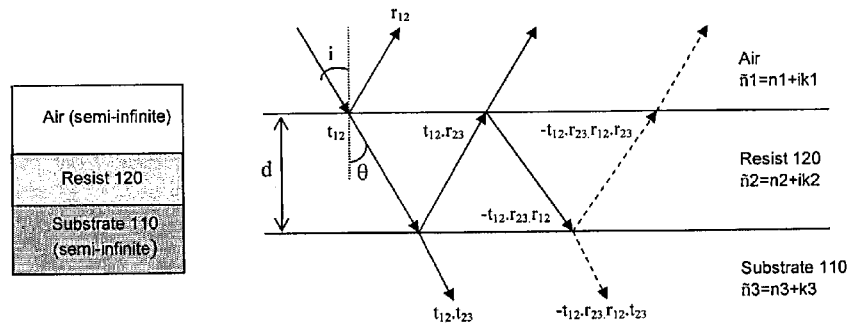
FIG. 9 illustrates an example of the stacking of layers modelled so as to determine the absorption curves of the resist according to its thickness.

The multilayer set or stack of layers comprising the photosensitive resist to be imprinted is illustrated in FIG. 9 and can be assimilated to a Fabry-Perot interferometer.

In this model the amplitude of the electrical field of the incident plane electromagnetic wave is termed E0 and the resulting amplitude of the waves reflected by the resist/substrate stack is termed Er. The coefficients of reflection rij and transmission tij corresponding to the complex amplitudes of the waves (Fresnel coefficients) are:

$$r_{ij} = \frac{\tilde{n}_i - \tilde{n}_j}{\tilde{n}_i + \tilde{n}_j}$$

and $$t_{ij} = \frac{2\tilde{n}_i}{\tilde{n}_i + \tilde{n}_j}$$

(in normal incidence i=0)
with:
$r_{ij}$: coefficient of reflection at the interface between the media i and j
$t_{ij}$: coefficient of transmission at the interface between the media i and j
ñi: complex index of the resist (ñ=n−ik)
ni: refractive index of the medium i. ni is the real part of the complex index ñ.
ki: coefficient of extinction of the medium i. ki is the imaginary part of the complex index ñ.
Let φ be the phase shift of a wave passing through the film of resist:

$$\phi = \frac{2\pi}{\lambda}\delta = \frac{2\pi}{\lambda}\tilde{n}_2 d\cos(\theta)$$

$\tilde{n}_2$: complex index of the resist (ñ=n−ik)
d: thickness of the film of resist
δ: optical path travelled by the wave in the resist
θ: angle of refraction
In our case, we are in normal incidence and therefore: θ=0 and $$\phi = \frac{2\pi}{\lambda}\tilde{n}_2 d.$$

Referring to FIG. 9, it can be seen that the phase shift between two consecutive reflected or transmitted waves is equal to 2φ. The resulting amplitude Er of the waves reflected by the film of resist is therefore equal to the sum:

$$E_r = r_{12}E_0 + t_{12}r_{23}t_{21}e^{-2i\phi}E_0 - t_{12}r_{23}^2 r_{12}t_{21}e^{-4i\phi}E_0 + t_{12}r_{23}^3 r_{12}^2 t_{21}e^{-6i\phi}E_0 - t_{12}r_{23}^4 r_{12}^3 t_{21}e^{-8i\phi}E_0 + \ldots$$

The reflection amplitude "r" is then equal to:

$$r = \frac{E_r}{E_0} =$$

$$r_{12} + t_{12}r_{23}t_{21}e^{-2i\phi}\left(1 - r_{23}r_{12}e^{-2i\phi} + (r_{23}r_{12}e^{-2i\phi})^2 - (r_{23}r_{12}e^{-2i\phi})^3 + \ldots\right) = r_{12} + \frac{t_{12}r_{23}t_{21}e^{-2i\phi}}{1 + r_{12}r_{23}e^{-2i\phi}}$$

however $$t_{21} = \frac{1 - r_{12}^2}{t_{12}} \Rightarrow r = \frac{r_{12} + r_{23}e^{-2i\phi}}{1 + r_{12}r_{23}e^{-2i\phi}}$$

By proceeding in the same way, the transmission amplitude "t" is obtained:

$$E_t = t_{12}t_{23}e^{-i\phi}E_0 - t_{12}r_{23}t_{23}r_{12}e^{-3i\phi}E_0 + t_{12}t_{23}r_{12}r_{23}e^{-5i\phi}E_0 - t_{12}t_{23}r_{12}^2 r_{23}^2 e^{-7i\phi}E_0 + \ldots$$

$$t = \frac{E_t}{E_0} = t_{12}t_{23}e^{-i\phi}\left(1 - r_{23}r_{12}e^{-2i\phi} + (r_{12}r_{23}e^{-2i\phi})^2 - (r_{12}r_{23}e^{-2i\phi})^3 + \ldots\right) =$$

$$\frac{t_{12}t_{23}e^{-i\phi}}{1 + r_{12}r_{23}e^{-2i\phi}} \Rightarrow t = \frac{t_{12}t_{23}e^{-i\phi}}{1 + r_{12}r_{23}e^{-2i\phi}}$$

The coefficients of reflection and transmission corresponding to the intensities of the waves, referred to as reflectivity R and transmission T, are equal to the squares of the respective moduli of the coefficients of amplitude:

$$R = |r|^2 = rr^* \text{ and } T = |t|^2 = tt^*$$

From the reflectivity and transmission it is possible to determine the absorption of the film of resist by means of the following equation:

$$R + T + A = 1$$

With:
R: the reflectivity
T: the transmission
A: the absorption

An example embodiment of a reversal of patterns, a non-limitative example, will now be described with reference to FIGS. 10, 11a to 11e.

Figure 10:
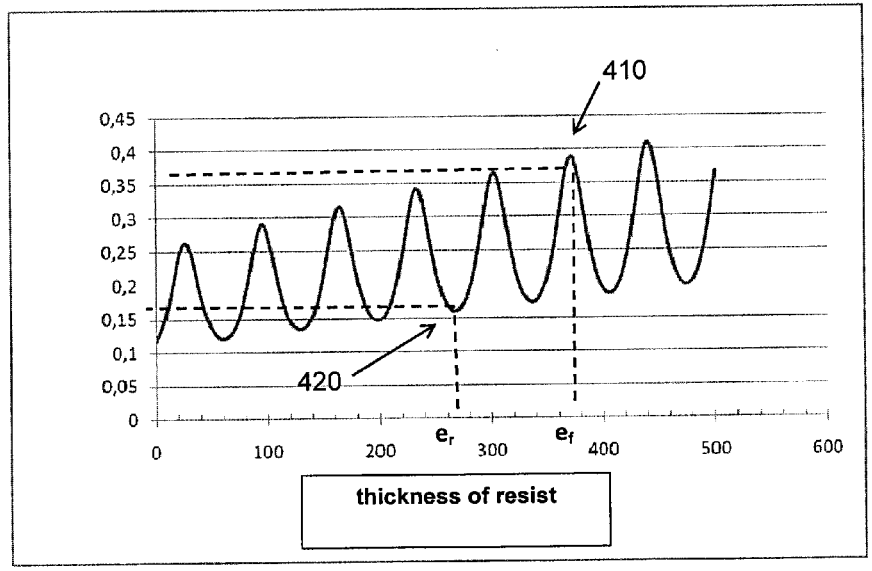
FIG. 10 illustrates an absorption curve of a layer of resist according to its thickness.

FIG. 10 illustrates the absorption of the resist used as a function of its thickness. This resist is a positive resist of the CAP112 type.

In this example, the layer of resist 120 initially has a thickness of 375 nm ($e_f$). The resist 120 is disposed on a silicon substrate 110.

The mould 50 used has projecting patterns 100 nm thick. Thus this is indeed the configuration where the initial thickness of resist ($e_f$) is close to an absorption peak 410 and the residual thickness of resist ($e_r$) after nanoimprinting (that is to say approximately 275 nm) is close to a minimum absorption 420. The thicknesses $e_f$ and $e_r$ corresponding to the adjacent areas delimiting each pattern are indicated in FIG. 10.

The protrusions on the mould have dense lines that make it possible, through the imprint step as illustrated in FIG. 11b, to imprint in the resist 120 patterns forming trenches approximately 250 nm wide separated by spaces also of 250 nm. In this way parallel lines with a width of approximately 250 nm are obtained, a pattern 127 forming a hollow line (thickness of $e_r$) being adjacent to the two patterns each forming a projecting line of thickness $e_f$.

The patterns obtained are illustrated in FIG. 11a with two different scales.

Following the imprint step, an exposure step is performed, for example at a wavelength λ=248 nm. During this step, only a half wafer is exposed. The bottom part 111, situated below the broken line in FIG. 11c, is not exposed. The top part 112 situated above the broken line in FIG. 11c is exposed. In this top part 112, the areas delimiting a pattern receive the same insolation dose. Thus the areas of resist having a thickness of resist $e_f$ and the areas of resist having a thickness of resist $e_r$ receive the same insolation dose in this part 112 of the wafer.

This insolation dose is chosen so as to be sufficient to activate the resist in the areas of high absorption (areas having a thickness $e_f$ in this example) and so as not to be sufficient to activate the resist in the areas of low absorption (areas having a thickness $e_r$). The resist being positive, the areas having a thickness $e_f$ are activated and disappear during development. The areas having a thickness $e_r$ are not activated and do not disappear during development. Thus only the pressed resist parts are preserved. The patterns shown schematically in FIG. 11*d* are then obtained, for the part 112 of the wafer subjected to exposure.

FIG. 11*d* also illustrates the patterns shown diagrammatically, which can be observed for the wafer part 111 not subjected to the exposure step.

FIGS. 11*c* and 11*d* thus clearly reveal that, following the same step of pressing a mould 50 into the resist 120, it is possible to obtain, by virtue of the method according to the invention, patterns that are the reverse of those obtained without the insolation step. In the case of an insolated wafer, the patterns projecting following the pressing step have disappeared. Following the exposure and development step, projecting patterns 126 have been formed from the residue of resist situated in the bottom of the hollow patterns 127 resulting from the pressing step. In a particularly advantageous manner, the projecting patterns 126 obtained do not have residues and are therefore directly usable.

Figure 11E:
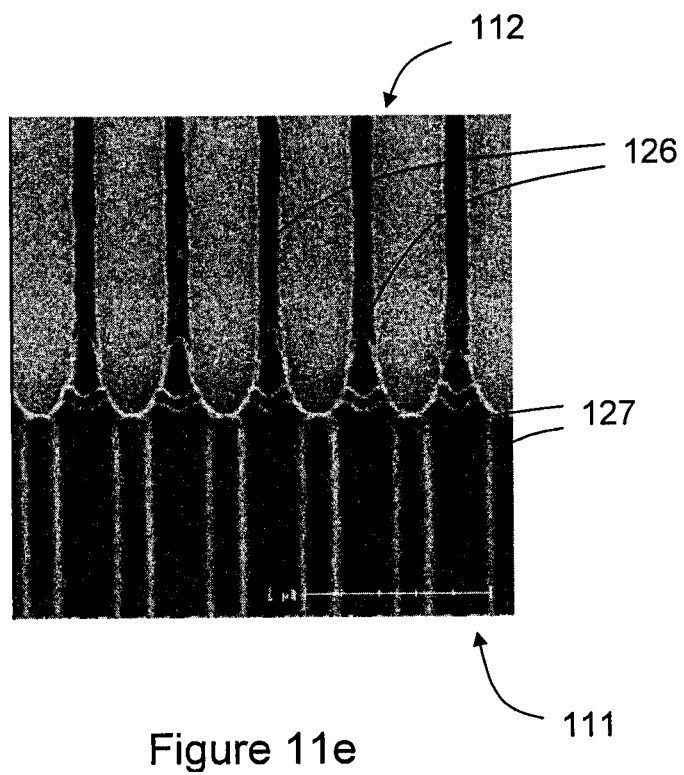

FIG. 11*e* is a photograph showing the difference in patterns at the junction between the exposed 112 and non-exposed 111 parts of the resist. This figure clearly shows that, in place of the patterns 127 formed recessed by the pressing of the mould 50, the resist 120 that has been exposed has projecting patterns 126.

In the context of the present invention, it is particularly advantageous to use so-called "threshold" resists. A threshold resist is spoken of when the chemical structure of the resist changes under a relatively quite precise insolation dose. In the case of a negative resist, this modification of the chemical structure of the resist can be assimilated to a cross-linking. In the case of a positive resist, this modification of the chemical structure of the resist can be assimilated to deprotection. Threshold resists are often characterised by a high contrast. This contrast is preferably greater than 1.

It should be noted that a high contrast of the resist facilitates the implementation of the present invention. The present invention may nevertheless be executed with resists having low contrast.

It should also be noted that the contrast of a resist is dependent on many parameters. Among the most important are: the type of substrate, the method used, and in particular the conditions for development of the resist. Among these conditions for development of the resist are the following parameters: annealing temperature and time after insolation; nature and concentration of the developer as well as temperature; development method and time.

Figure 12A:
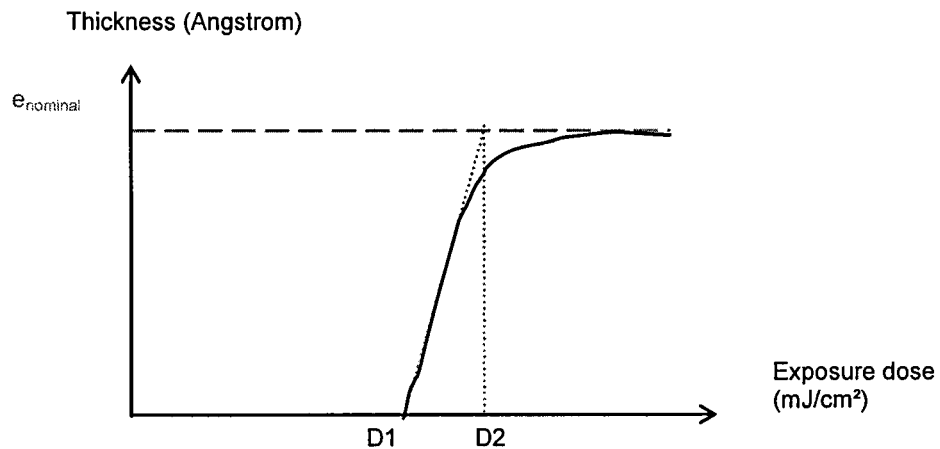
FIGS. 12a and 12b are examples of curves for determining the contrast of a respectively negative and positive resist.
Figure 12B:
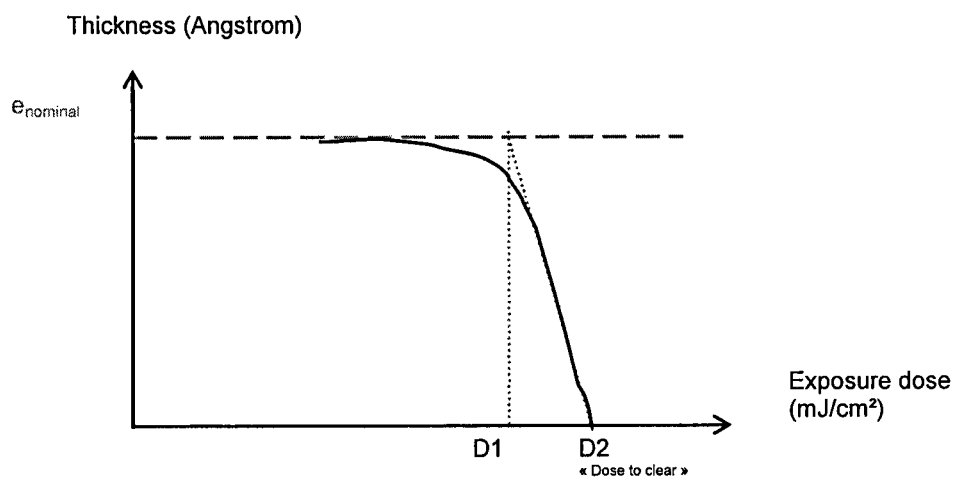

The thickness of resist after insolation and development varies according to the patterns and the insolation dose. In order to approximate the value of the contrast, a curve representing the residual thickness of resist as a function of the insolation dose can be traced. FIGS. 12*a* and 12*b* illustrate such curves for negative and positive resists respectively.

The contrast $\gamma$ can then be determined by the following equation:

$$\gamma = \left[\log_{10}\left(\frac{D_2}{D_1}\right)\right]^{-1}$$

These curves can for example be obtained by insolating identical patterns, on the same wafer, with an increasing insolation dose. It is then necessary to measure the residual thickness of resist after development for each insolation dose.

In the example illustrated, squares with sides of 9 mm were insolated in order to ignore the phenomena of lateral diffusion of the photogenerated acid, since in these examples chemical-amplification resists of the NEB22 and CAP112 type were used.

In conclusion, it will be remarked that the method of the invention takes advantage of two phenomena: one is the absorption differential of the resist as a function of its thickness and the other that is related to the dimension of the patterns and the high doses that it is necessary to apply to insolate smaller patterns. Depending on whether a positive resist or a negative resist is used, advantage can be taken of the two phenomena or of the single phenomena related to absorption in accordance with the following table:

|  | Positive Resist | Negative Resist |
| --- | --- | --- |
| Reversal of the image | Dimension of the patterns and absorption | Absorption differential only |
| Removal of the residue | Absorption differential only | Dimension of the patterns and absorption |

The embodiments in FIGS. 7 and 8 can be combined. In particular, for the same wafer it is possible to use a variable-topography mould and different exposure doses.

The invention is not limited to the embodiments described above but extends to any embodiment in accordance with its spirit.

The invention claimed is:

1. A nanometric imprint lithography method comprising:
   a preparation during which a photosensitive resist is disposed on a substrate;
   at least one pressing a mold in the resist to form in the resist at least one imprint pattern delimited at least partly by two adjacent areas, one of the two areas having a thickness less than a thickness of the other one of the two areas;
   exposing at least the two areas during which the two areas receive a same insolation dose; and
   wherein the thicknesses of the two areas are defined so that, to be activated, the resist in one of the two areas requires an insolation dose different from the insolation dose necessary for activating the resist in the other one of the two areas, and the insolation dose afforded by the exposure is determined so as to be sufficiently great to activate the resist in only one of the two areas and so as not to be sufficiently great to activate the other one of the two adjacent areas.

2. A method according to claim 1, wherein the absorption of the insolation dose by the resist according to its thickness defines a substantially sinusoidal curve, and wherein the thickness of the resist in one of the two areas corresponds substantially to a maximum of the sinusoidal curve and the thickness of the resist in the other one from the two areas corresponds substantially to a minimum of the sinusoidal curve.

3. A method according to claim 1, wherein the thicknesses of the resist in the two areas are determined so that the difference between the dose necessary for activating one of the two areas and the dose necessary for activating the other one of the two areas is at least 5 mJ/cm$^2$.

4. A method according to claim 1, wherein the resist is a positive photosensitive resist, the thicknesses are determined so that the resist in the area having a lowest thickness has an absorption less than that of the resist in the area having a greatest thickness, and wherein the insolation dose afforded by the exposure is defined so as to activate the resist in the area having the greatest thickness and to not activate the resist in the area having the lowest thickness, so as to obtain a final pattern that is the reverse of the imprint pattern.

5. A method according to claim 1, wherein the resist is a negative photosensitive resist, the thicknesses are determined so that the resist in the area having a lowest thickness has an absorption greater than that of the resist in the area having a greatest thickness, and wherein the insolation dose afforded by the exposure is defined so as to activate the resist in the area having the lowest thickness and to not activate the resist in the area having the greatest thickness, so as to obtain a final pattern that is the reverse of the imprint pattern.

6. A method according to claim 4, wherein, after development of the resist, an additional etching is performed to remove a residue of resist remaining on the substrate in the area having the greatest thickness after the development.

7. A method according to claim 5, wherein, after development of the resist, an additional etching is performed to remove a residue of resist remaining on the substrate in the area having the greatest thickness after the development.

8. A method according to claim 1, wherein the resist is a positive photosensitive resist, the thicknesses are determined so that the resist in the area having a lowest thickness has an absorption greater than that of the resist in the area having a greatest thickness, and wherein the insolation dose afforded by the exposure is defined so as to activate the resist in the area having the lowest thickness and to not activate the resist in the area having the greatest thickness, so as to eliminate a residue of resist in the area having the lowest thickness.

9. A method according to claim 1, wherein the resist is a negative photosensitive resist, the thicknesses are determined so that the resist in the area having a lowest thickness has an absorption greater than that of the resist in the area having the greatest thickness, and wherein the insolation dose afforded by the exposure step is defined so as to activate the resist in the area having the greatest thickness and to not activate the resist in the area having the lowest thickness, so as to eliminate a residue of resist in the area having the lowest thickness.

10. A method according to claim 1, wherein, after the pressing, a plurality of imprint patterns having different thicknesses are obtained, at least one of these thicknesses corresponds to an absorption maximum, and at least another one of these thicknesses corresponds to an absorption minimum.

11. A method according to claim 10, wherein the mold includes projecting protrusions of different heights.

12. A method according to claim 1, wherein, during the exposure, all the resist is exposed to the insolation dose.

13. A method according to claim 1, wherein portions of the resist are insolated with different insolation doses.

14. A method according to claim 13, wherein, during the exposure, at least one first pattern having a first dimension is insolated, the dimension being taken in a direction substantially normal to the thickness of the resist, with a first insolation dose, and at least one second pattern having a second dimension lower than the first dimension is insolated with a second insolation dose higher than the first insolation dose.

15. A method according to claim 14, wherein the first insolation dose is sufficient to activate only one of the two areas of the first pattern, and wherein the second insolation dose is insufficient to activate the second pattern but is sufficient to activate one of areas bordering the second pattern.

16. A method according to claim 1, wherein the insolation dose is provided by a coherent light source.

17. A method according to claim 1, wherein the exposure successively includes plural several light sources having different wavelengths.

18. A method according to claim 1, further comprising, during the preparation, depositing the photosensitive resist on a layer or a substrate taken from materials of SiC, Ge, Ag, W, AlSi.

19. A method according to claim 1, further comprising, during the preparation, depositing the photosensitive resist on a layer or substrate made from silicon.

20. A multilayer assembly comprising:
a substrate covered with a layer of photosensitive resist, the resist having at least one imprint pattern, delimited at least partly by two areas having different thicknesses,
wherein the thicknesses of the two areas correspond to a maximum and a minimum of an absorption curve of the resist, respectively, according to its thickness.

* * * * *